US012588224B2

(12) United States Patent
Leng

(10) Patent No.: US 12,588,224 B2
(45) Date of Patent: Mar. 24, 2026

(54) METAL-INSULATOR-METAL (MIM) CAPACITORS WITH CURVED ELECTRODE

(71) Applicant: Microchip Technology Incorporated, Chandler, AZ (US)

(72) Inventor: Yaojian Leng, Vancouver, WA (US)

(73) Assignee: Microchip Technology Incorporated, Chandler, AZ (US)

( * ) Notice: Subject to any disclaimer, the term of this patent is extended or adjusted under 35 U.S.C. 154(b) by 493 days.

(21) Appl. No.: 18/162,775

(22) Filed: Feb. 1, 2023

(65) Prior Publication Data

US 2024/0170529 A1 May 23, 2024

Related U.S. Application Data

(60) Provisional application No. 63/426,256, filed on Nov. 17, 2022.

(51) Int. Cl.
 *H01L 21/02* (2006.01)
 *H10D 1/68* (2025.01)
(52) U.S. Cl.
 CPC .................................. *H10D 1/692* (2025.01)
(58) Field of Classification Search
 CPC .............................. H10D 1/692; H10D 1/711
 See application file for complete search history.

(56) References Cited

U.S. PATENT DOCUMENTS

| | | | |
|---|---|---|---|
| 2002/0140008 A1* | 10/2002 | Yasuda | H10D 84/811 257/E21.507 |
| 2007/0246799 A1* | 10/2007 | Kawano | H01L 21/76816 257/532 |
| 2008/0050874 A1* | 2/2008 | Won | H01L 23/53238 438/250 |
| 2013/0234288 A1 | 9/2013 | Gu et al. | 257/532 |
| 2021/0043560 A1 | 2/2021 | Leng | |

OTHER PUBLICATIONS

International Search Report and Written Opinion, Application No. PCT/US2023/020648, 10 pages.

* cited by examiner

*Primary Examiner* — John A Bodnar
(74) *Attorney, Agent, or Firm* — SLAYDEN GRUBERT BEARD PLLC

(57) ABSTRACT

A method for making a metal-insulator-metal (MIM) capacitors by etching a dielectric layer to form a via or contact hole, a tub, and a trench in the dielectric layer; depositing conformal metal in the via or contact hole, the tub, and the trench, wherein deposited conformal metal forms a via or contact in the via or contact hole; depositing a bottom electrode metal in the tub to form a bottom electrode of a metal-to-metal (MIM) capacitor; removing bottom electrode metal from the bottom electrode to form a dish-shape upper surface; depositing an insulator material on the bottom electrode to form an insulator layer of the MIM capacitor; and depositing a top electrode metal on the insulator layer to form a top electrode of the MIM capacitor.

21 Claims, 18 Drawing Sheets

$P_{actual} = 10 * P_{applied}$ $$P_{actual} = P_{applied} / \text{PATTERN DENSITY}$$

$$P_{actual} = 2 * P_{applied}$$

$$P_{actual} = P_{applied}$$

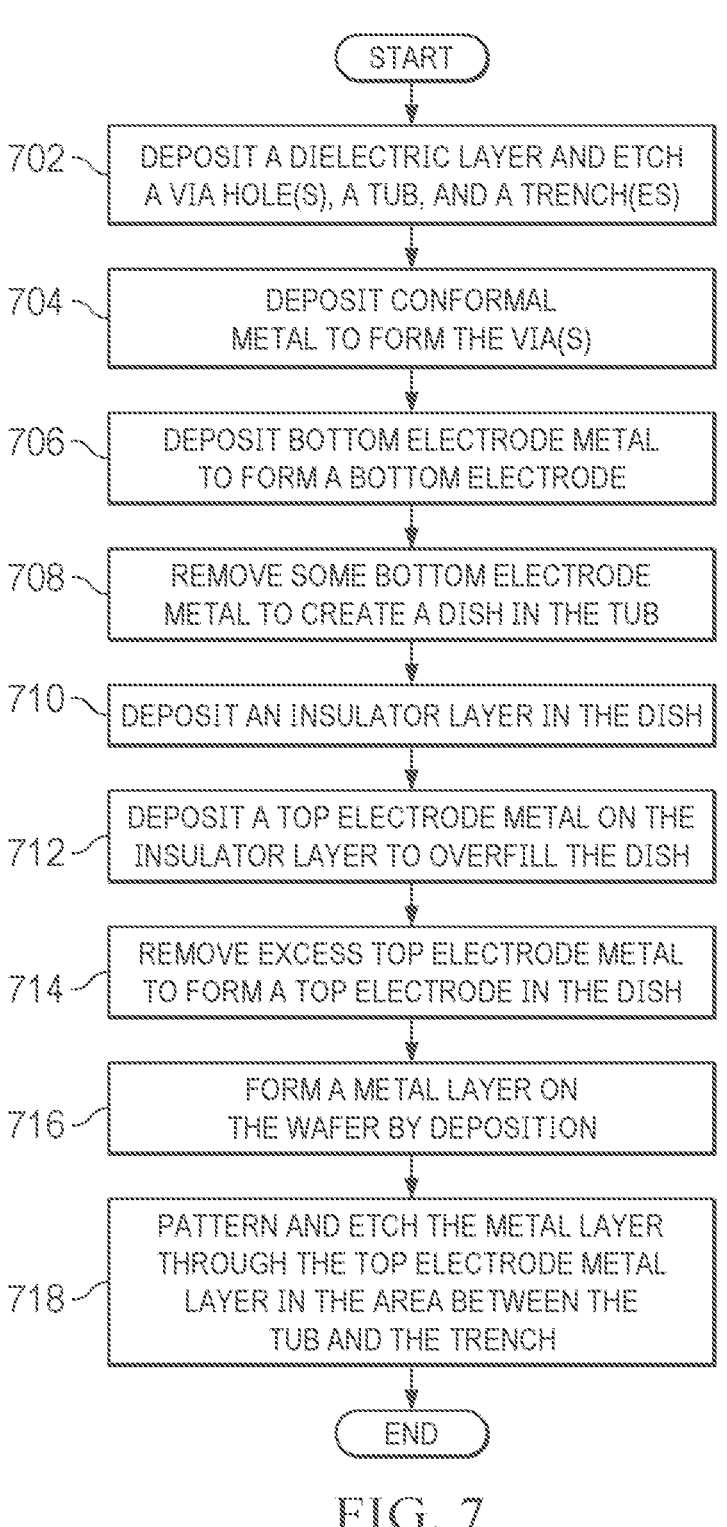

START

702 — DEPOSIT A DIELECTRIC LAYER AND ETCH A VIA HOLE(S), A TUB, AND A TRENCH(ES)

704 — DEPOSIT CONFORMAL METAL TO FORM THE VIA(S)

706 — DEPOSIT BOTTOM ELECTRODE METAL TO FORM A BOTTOM ELECTRODE

708 — REMOVE SOME BOTTOM ELECTRODE METAL TO CREATE A DISH IN THE TUB

710 — DEPOSIT AN INSULATOR LAYER IN THE DISH

712 — DEPOSIT A TOP ELECTRODE METAL ON THE INSULATOR LAYER TO OVERFILL THE DISH

714 — REMOVE EXCESS TOP ELECTRODE METAL TO FORM A TOP ELECTRODE IN THE DISH

716 — FORM A METAL LAYER ON THE WAFER BY DEPOSITION

718 — PATTERN AND ETCH THE METAL LAYER THROUGH THE TOP ELECTRODE METAL LAYER IN THE AREA BETWEEN THE TUB AND THE TRENCH

END

FIG. 7

METAL-INSULATOR-METAL (MIM) CAPACITORS WITH CURVED ELECTRODE

RELATED PATENT APPLICATIONS

This application claims priority to commonly owned U.S. Patent Application No. 63/426,256 filed Nov. 17, 2022, the entire contents of which are hereby incorporated by reference for all purposes.

TECHNICAL FIELD

The present disclosure relates to metal-insulator-metal (MIM) capacitors, for example, MIM capacitors in analog/mixed signal/RF-CMOS circuits.

BACKGROUND

A metal-insulator-metal (MIM) capacitor is a capacitor constructed with a metal top electrode, a metal bottom electrode, and an insulator (dielectric) sandwiched between the two metal electrodes.

MIM capacitors are important components in many electrical circuits, for example in many analog, mixed-signal, and radio-frequency complementary metal-oxide semiconductors (RF CMOS) circuits. MIM capacitors typically provide better performance than alternatives, such as POP (Poly-Oxide-Poly) capacitors and MOM (Metal-Oxide-Metal Lateral Flux) capacitors, due to lower resistance, better matching, and/or better signal/noise ratio.

MIM capacitors are typically provided built just below the top metal layer, for example, using the existing Top-1 Metal layer as the bottom electrode, constructing a top electrode with a different metal (e.g., Ti/TiN, Ta/TaN, W), and connecting an overlying Top Metal layer to the top and bottom electrodes of the capacitor through respective vias.

Conventional MIM capacitors are built on an aluminum interconnect and include an insulator layer formed between an aluminum bottom electrode (Top-1 Metal layer) and a metal top electrode (e.g., Ti, TiN, or Al). The Al bottom electrode and metal top electrode are each connected to a respective pad (Top Metal layer) by one or more vias, e.g., each formed by filling a via hole with tungsten (W) or other suitable metal. The insulator layer may be a SiN layer having a thickness of about 500 Å, for example.

Another conventional MIM capacitor is built on a copper (Cu) interconnect and includes an insulator layer formed between a Cu bottom electrode (Top-1 Metal layer) and a metal top electrode (e.g., Ta, TaN, or TiN). The Cu bottom electrode and metal top electrode are each connected to a respective pad (Top Metal layer) by one or more vias, e.g., each formed by filling a via hole with copper or other suitable metal. As with a capacitor built on Al interconnect, the insulator layer of a capacitor built on Cu interconnect may be a SiN layer having a thickness of about 500 Å, for example. An insulator layer also acts as a dielectric diffusion barrier for the copper of the bottom electrode.

As used herein, a "via" refers to a conductive via formed by plugging or otherwise depositing a conductive material (e.g., tungsten) in a via hole having a small diameter or width, e.g., a diameter or width below 1 μm, and thus having a relatively large resistance, e.g., a resistance of at least 1 ohm per via. For example, conventional vias typically have a small diameter in the range of 0.1 μm to 0.5 μm, and may have a resistance of about 10 ohms/via, for example, especially for vias formed from tungsten or other highly resistive material. Thus, conventional MIM capacitors often include multiple vias (e.g., multiple vias between the top electrode and top electrode pad and/or multiple vias between the bottom electrode and bottom electrode pad) to reduce the overall resistance to some extent. As used herein, a "via connection" in the context of an MIM capacitor refers to a via extending from a capacitor electrode (top electrode or bottom electrode) to an overlying conductive pad.

MIM capacitors may also be built between a poly (e.g. poly silicide) layer and a metal layer. The poly layer may be connected to a pad in a metal layer by one or more contacts, each formed by filling a contact hole with a suitable material. As used herein, a "contact" refers to a conductive contact formed by plugging or otherwise depositing a conductive material (e.g., tungsten) in a contact hole having a small diameter or width, e.g., a diameter or width below 1 μm, and thus having a relative large resistance, e.g., a resistance of at least 1 ohm per contact. For example, conventional contacts typically have a small diameter in the range of 0.1 μm to 0.5 μm, and may have a resistance of about 10 ohms/contact, for example, especially for contacts formed from tungsten or other highly resistive material. Thus, conventional MIM capacitors often include multiple contacts (e.g., multiple contacts between the poly/active layer forming a bottom electrode and a bottom electrode pad) to reduce the overall resistance to some extent. As used herein, a "contact connection" in the context of an MIM capacitor refers to a contact extending from a poly capacitor electrode to an overlying conductive pad.

As indicated above, MIM capacitors may offer better performance over other alternatives due to lower resistance, better matching, and better Signal/Noise ratio. For example, MIM capacitors may offer better performance than POP (Poly-Oxide-Poly) capacitors and MOM (Metal-Oxide-Metal Lateral Flux) capacitor. In addition, in MIM capacitors, the resistance of each of the top electrode and bottom electrode typically impacts the MIM capacitor performance, particularly when used in RF applications. In addition, MIM capacitors are typically expensive to build, e.g., as compared with other certain types of capacitors. For example, MIM capacitors typically require additional mask layers and many additional process steps, as compared with POP (Poly-Oxide-Poly) capacitors and MOM (Metal-Oxide-Metal Lateral Flux) capacitors.

A conventional MIM capacitor may be constructed with a top electrode, a bottom electrode, and an insulator (dielectric) sandwiched in-between, hence Metal-Insulator-Metal (MIM). The MIM capacitor may be built between a Mx metal layer and a Mx+1 metal layer. The MIM capacitor includes an insulator layer formed between a bottom electrode (a portion of the Mx metal layer) and a metal top electrode. The bottom electrode and metal top electrode are each connected to a respective contact and by one or more vias. Pads and may be etched or formed in the Mx+1 metal layer.

Typically, MIM capacitors may be built with an additional mask layer to define the top electrode, and therefore, may be more expensive to manufacture compared to MOM and POP capacitors. If the bottom electrode is made of aluminum, it can be rough and have hillocks or protrusions, which cause low and uncontrolled breakdown voltage. Conventional MIM capacitors may suffer from low and uncontrolled breakdown voltage due to hillocks or protrusions located in the bottom electrode, in particular, aluminum bottom plates. As used herein, a hillock is a protrusion large enough to substantially reduce the breakdown voltage of the MIM capacitor.

There is a need for MIM capacitors that may be manufactured at lower cost, particularly without the added mask layer, and with improved breakdown voltage, by having fewer hillocks.

SUMMARY OF THE INVENTION

Aspects include a method of building a MIM capacitor in a MIM module, that may be performed concurrently with building an interconnect structure without the use of additional masks. An aspect of the process builds a MIM capacitor without a mask by etching a trench in a dielectric layer so a first chemical mechanical polishing (CMP) of the entire integrated circuit structure dishes and erodes bottom electrode metal adjacent the trench to a depth sufficient to build a MIM capacitor whose bottom electrode is below the upper surface of the dielectric layer. With the MIM capacitor bottom electrode below than the upper surface of the dielectric layer across the rest of the integrated circuit structure, a second CMP polishes away dielectric layer material from the rest of the chip without damaging the dielectric layer of the MIM capacitor. Aspects further include a MIM capacitor in a MIM module, wherein the MIM capacitor has a dish-shaped bottom electrode.

An aspect provides a method comprising: etching a dielectric layer to form a via or contact hole, a tub, and a trench in the dielectric layer; depositing conformal metal in the via or contact hole, the tub, and the trench, wherein the deposited conformal metal forms a via or contact in the via or contact hole; depositing a bottom electrode metal in the tub to form a bottom electrode of a metal-to-metal (MIM) capacitor; removing a portion of the bottom electrode metal from the bottom electrode to form a dish-shape upper surface of the bottom electrode; depositing an insulator material on the bottom electrode to form an insulator layer of the MIM capacitor; and depositing a top electrode metal on the insulator layer to form a top electrode of the MIM capacitor.

According to an aspect, there is provided a device comprising: a metal-insulator-metal (MIM) capacitor comprising: a bottom electrode comprising a bottom electrode metal and having a dish-shape upper surface; a top electrode comprising a top electrode metal and having a substantially convex lower surface positioned opposite the dish-shape upper surface of the bottom electrode; and an insulator layer between the top electrode and the bottom electrode.

BRIEF DESCRIPTION OF THE DRAWINGS

The figures illustrate example methods of building a MIM capacitor in a MIM module concurrently with an interconnect structure without the use of additional masks, and example MIM capacitors having dish-shaped bottom electrodes.

FIG. 1 shows a cross-sectional, side view of a Metal-Insulator-Metal (MIM) module having a MIM capacitor constructed with a curved top electrode, a curved bottom electrode, and a curved insulator (dielectric) sandwiched between.

FIG. 3I shows a cross-sectional, side view of the interconnect structure and the MIM module of FIG. 3F after an Mx+1 metal layer deposition has been formed on the wafer.

FIG. 7 shows a flow chart for a method of building a MIM capacitor.

The reference number for any illustrated element that appears in multiple different figures has the same meaning across the multiple figures, and the mention or discussion herein of any illustrated element in the context of any particular figure also applies to each other figure, if any, in which that same illustrated element is shown.

DESCRIPTION

Aspects provide methods of building a MIM capacitor in a MIM module, which may be performed concurrently with building an interconnect structure without the use of additional masks, and example MIM capacitors have dish-shaped bottom electrodes. There is no requirement to build an interconnect structure simultaneously, and the method of building a MIM capacitor in a MIM module may be performed without concurrently building an interconnect structure, without exceeding the scope.

Figure 1:
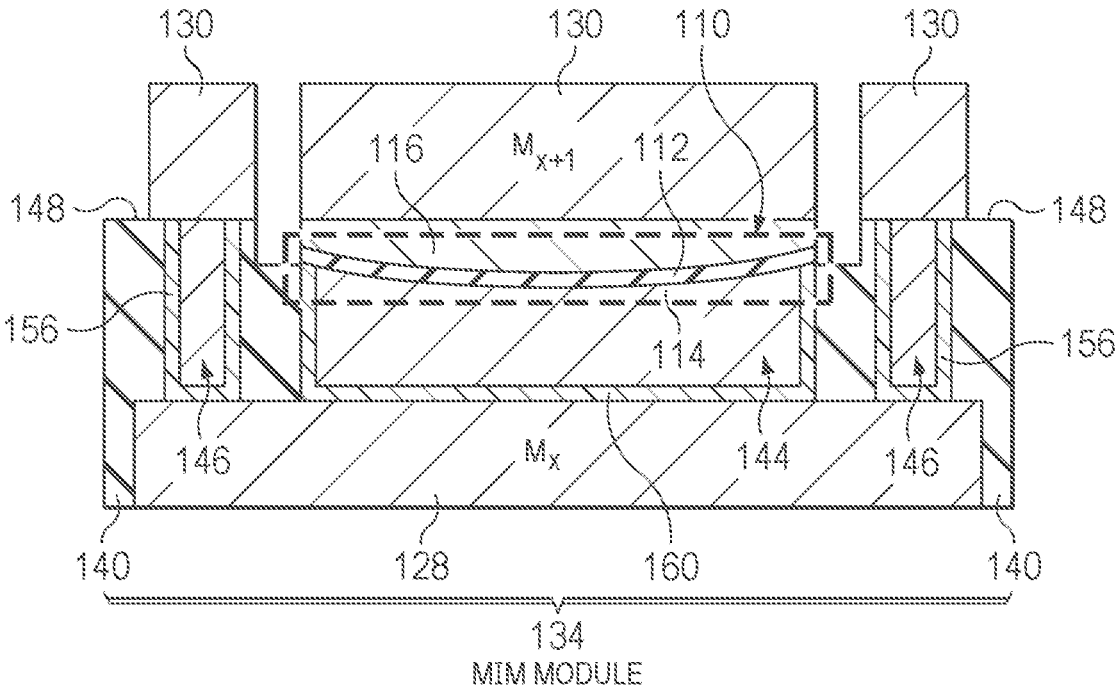

FIG. 1 shows a cross-sectional, side view of a MIM module 134 having an MIM capacitor 110. The MIM capacitor 110 may be built in a dielectric layer 140 between Mx metal layer 128 and Mx+1 metal layer 130. The dielectric layer 140 may have a tub 144 and a trench 146. A tub 144 is a recess in the dielectric layer 140 in which MIM capacitor 110 may be built. Trench 146 is a recess in the dielectric layer 140 near the tub 144 that facilitates removal of material to form a curved electrode. MIM capacitor 110 may be built in the tub 144 and be comprised of a bottom electrode 114, an insulator layer 112, and a top electrode 116. The bottom electrode 114 is below the upper surface 148 of the dielectric layer 140. The bottom and top electrodes 114 and 116 may be in the form of plates. A bottom electrode connection 156 may be optionally formed in the trench 146. The MIM capacitor 110 may be surrounded by trenches 146 (single or multiple trenches, or dummy trenches), so that a polishing step may be used to remove a portion of bottom electrode material to create a slightly curved surface of the bottom electrode material in the dielectric layer 140 where the MIM capacitor 110 is to be formed. Optionally, trenches 146 can also serve as bottom electrode connection 156. The bottom electrode 114 may be made of refractory metal and may be polished so the surface is smooth and substantially hillock-free. For purposes of this disclosure, hillock-free means the surface has no hillocks or protrusions large enough to substantially reduce the breakdown voltage of the MIM capacitor 110. Refractory metals are a class of metals that are highly resistant to heat and wear. In this disclosure, they are metals used in a semiconductor process (e.g., Ti, TiN, W, Ta, TaN, Co) with a melting point temperature significantly higher than 400 C. Because backend-of-the-line (BEOL) semiconductor processes are controlled to be below ~400 C, refractory metals may not generate hillocks from thermal stress relief and may therefore provide capacitors with high and consistent breakdown voltage. For example, tungsten or cobalt may be used without generating hillocks. A hillock free surface may have a tighter breakdown voltage distribution because it has no outliers and may be the result of using refractory metals. Alternatively, aluminum Al can be used with high radiofrequency RF power during deposition (a so called smooth metal) with large grain size and reduced film roughness.

Figure 2:
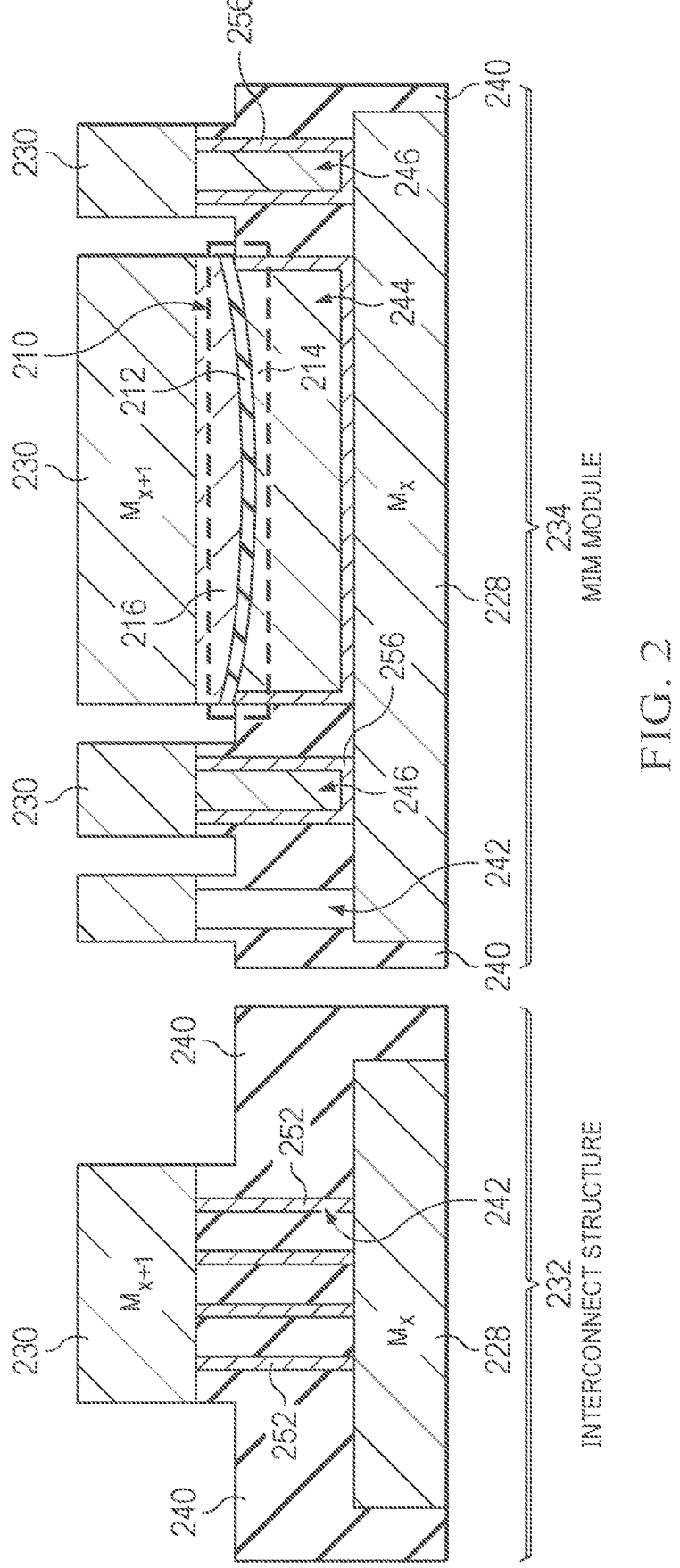
FIG. 2 shows a cross-sectional, side view of an interconnect structure and a MIM module having a MIM capacitor, wherein the MIM capacitor has a dish-shape surface.

FIG. 2 shows a cross-sectional, side view of an interconnect structure 232 and MIM module 234 having an MIM capacitor 210. This approach builds a MIM capacitor 210 concurrently with interconnect structures 232, which does not require a mask to be added as part of the build process. The MIM capacitor 210 may be built in a dielectric layer 240 between Mx metal layer 228 and Mx+1 metal layer 230. The dielectric layer 240 may have a via hole 242, a tub 244 and a trench 246. A tub 244 is a recess in the dielectric layer 240 in which a MIM capacitor 210 may be built, as described further below. A trench 246 is a recess in the dielectric layer 240 near a tub 244 that facilitates removal of material to form a curved electrode, as described further below. A MIM capacitor 210 may be built in the tub 244 and be comprised of a bottom electrode 214, an insulator layer 212, and a top electrode 216. A via(s) 252 may be deposited in the via hole(s) 242 of the interconnect structure 232. A bottom electrode connection 256 may be optionally formed in the trench 246. The capacitor 210 may be surrounded by trenches 246 (single or multiple trenches, or dummy trenches), so that a polishing step may be used to remove a portion of bottom electrode material to allow for the capacitor 210 to be formed in the tub 244. The polishing step creates a slightly curved surface of the bottom electrode material in the dielectric layer 240 where the capacitor 210 is to be formed. Optionally, trenches 246 can also serve as bottom electrode connection 256 besides the use of a tungsten W via 252 (Via-x). The bottom electrode 214 may be made of refractory metal and may be polished so the surface is smooth and substantially hillock-free. For purposes of this disclosure, hillock-free means the surface has no hillocks or protrusions large enough to substantially reduce the breakdown voltage of the MIM capacitor 210.

Figure 3A:
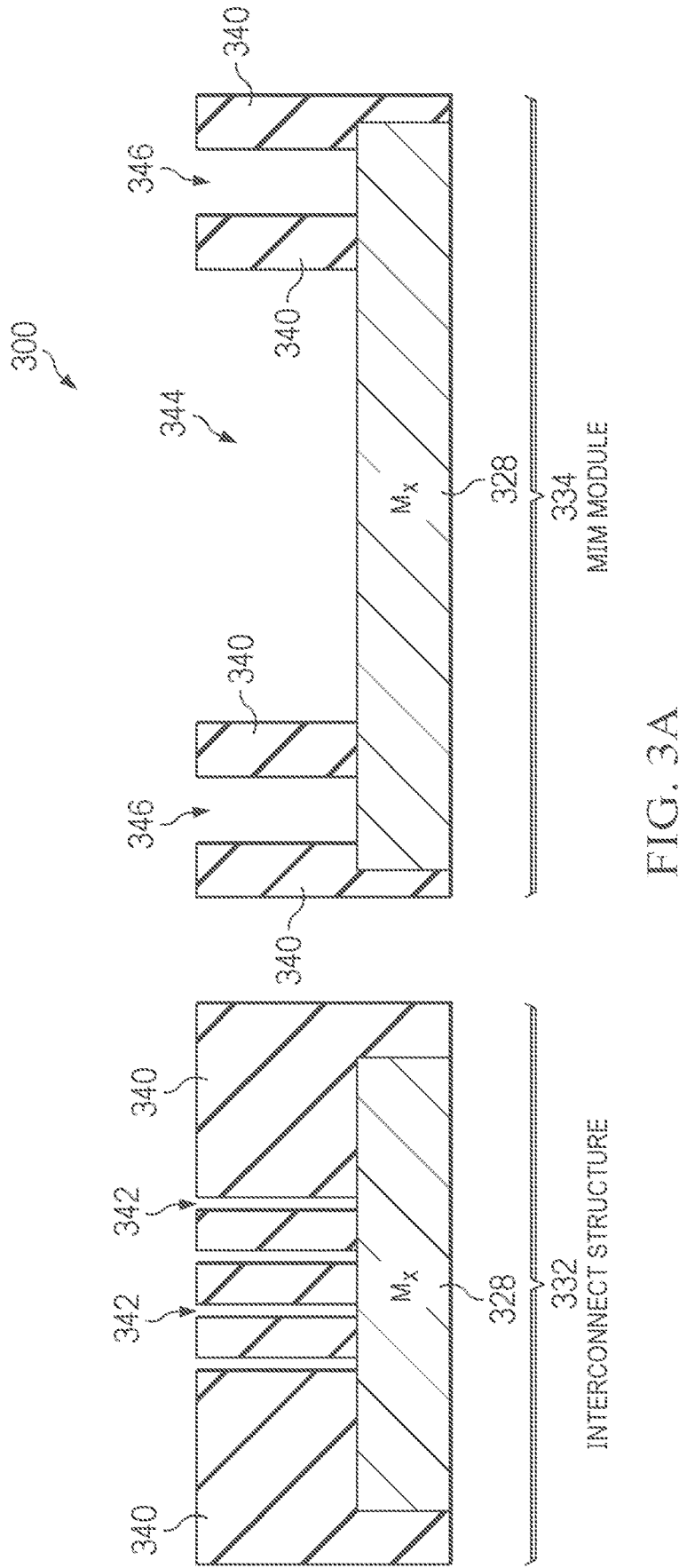
FIG. 3A shows a cross-sectional, side view of a wafer and an etched dielectric layer for building a MIM capacitor in a MIM module simultaneously with an interconnect structure.

FIGS. 3A-3J illustrate an example process for forming an MIM capacitor according to one aspect. Each of FIGS. 3A-3J shows cross-sectional views at two locations of an integrated circuit structure 300 under construction, namely a first location (labelled "Interconnect Structure" 332) at which an upper level metal pad is formed connected to a Mx metal layer 328, for example a Cu MTOP layer, as shown in FIG. 3A, and a second location (labelled "MIM Module" 334) at which an MIM capacitor 310 is being built.

FIG. 3A shows cross-sectional side views of a wafer upon which a MIM module 334 comprising a MIM capacitor may be made. The Mx metal layer 328 may be, for example, any layer of interconnect metal. The MIM module 334 may be built concurrently with the interconnect structure 332. The MIM module 334 starts with a dielectric layer 340 being applied to the Mx metal layer 328 of the wafer. A chemical mechanical planarization (CMP) may be performed. A photoresist layer (not shown) may be deposited over dielectric layer 340 and patterned to define openings to form a via hole(s) 342, a tub 344, and a trench(s) 346. An etch may then be performed through the openings in the photoresist layer to define the via hole(s) 342, the tub 344, and the trench(s) 346 exposing top surface areas of the Mx metal layer 328. The via hole 342 is patterned concurrently with a tub 344 (large size opening) and a trench 346 (a dummy pattern surrounding the tub 344 to reduce the pattern density, as will be described further) in the dielectric layer 340. The via holes 342 are small, typically in the range of 0.1 μm-0.5 μm, the tub 344 is relatively large, e.g., in the range of 1 μm-100 μm, and the trench 346 width dimension is between the diameter of via hole 342 and the diameter or width of the tub 344, e.g., in the range of 1 μm-10 μm. As shown in FIG. 3A, the tub 344 is surrounded by the trench 346. A single trench is shown in FIG. 3A, but alternatively, multiple trenches with different widths may be implemented to achieve desired pattern density variations. A plasma etch may be performed on the dielectric layer 340 to create the via hole(s) 342 in the interconnect structure 332, the tub 344 in the MIM module 334, and the trench(s) 346 in a dummy structure around the tub 344.

Figure 3B:
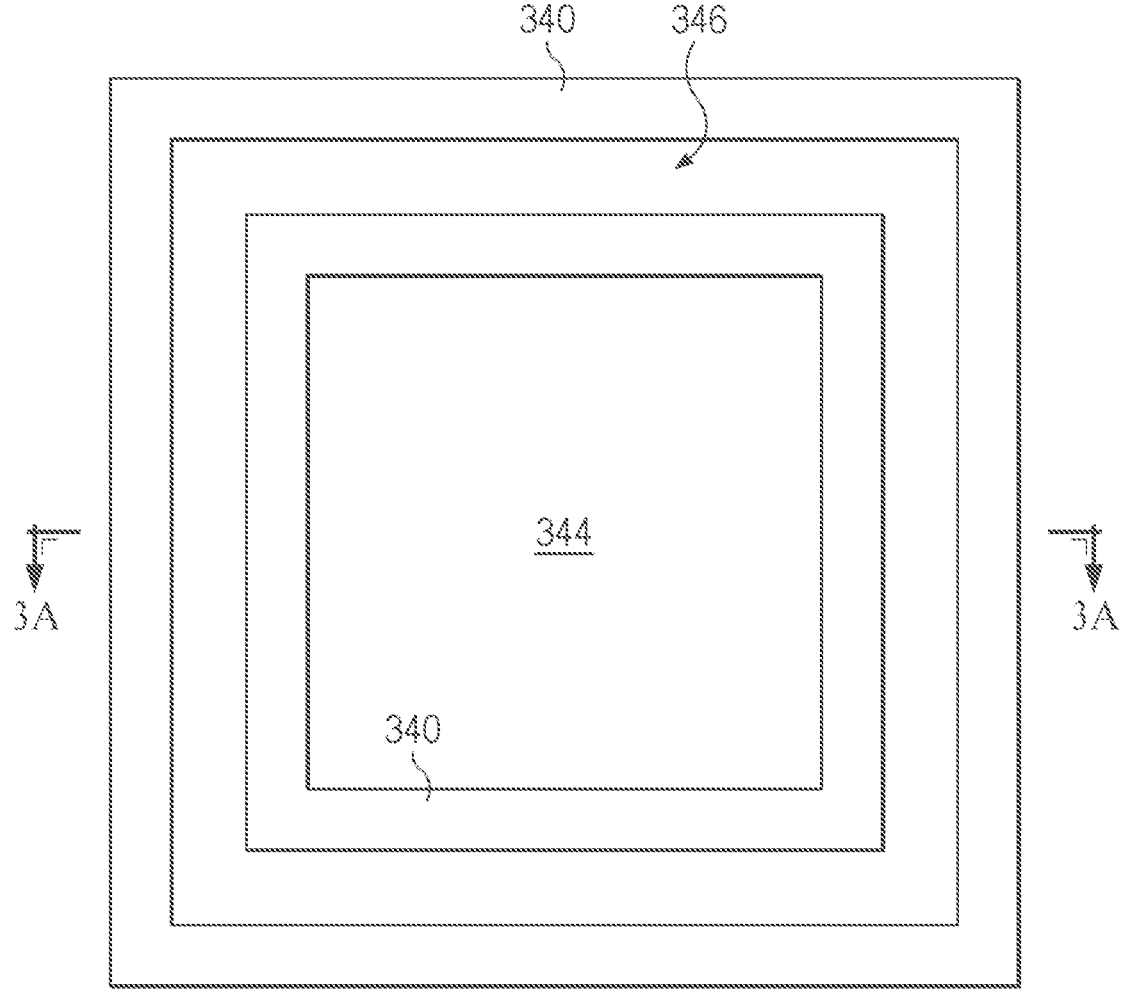
FIG. 3B shows a top view of the wafer of FIG. 3A, wherein the trench is a continuous trench surrounding the tub.
Figure 3C:
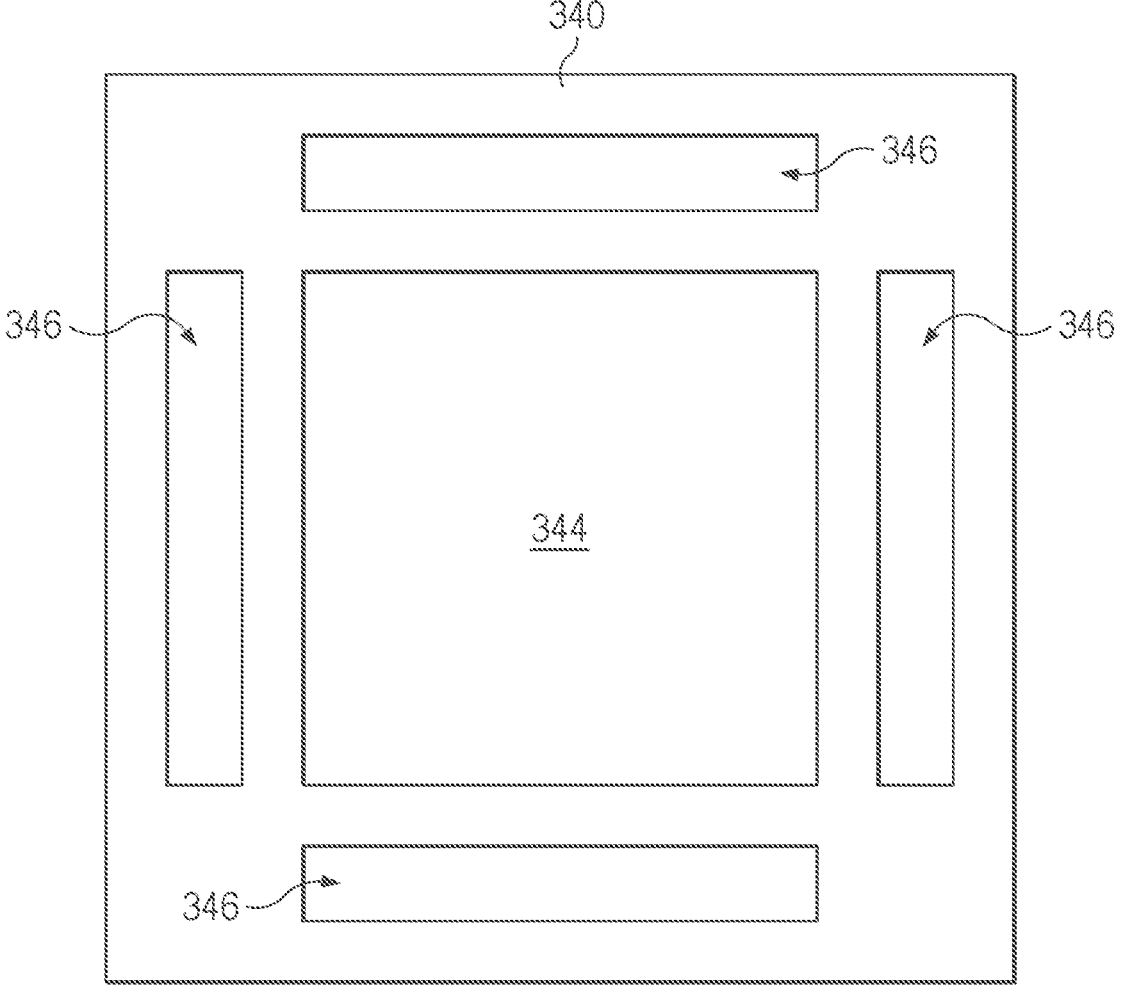
FIG. 3C shows a top view of the wafer of FIG. 3A, wherein the trench may be segmented, for example, four trenches in four directions surrounding the tub, but not connected.

FIG. 3B shows a top view of the MIM capacitor (under construction) illustrated in FIG. 3A, wherein the trench 346 is a continuous trench around the perimeter of the tub 344. A portion of dielectric layer 340 extends completely around a perimeter of the tub 344, where the MIM capacitor will be built, and wherein the trench 346 extends completely around a perimeter of the portion of dielectric layer material 340. FIG. 3C shows a top view of an alternative example of the MIM capacitor (under construction) illustrated in FIG. 3A, wherein the trench 346 is a segmented trench comprising a series of separate trenches around the perimeter of the tub 344, for example, four trenches in four directions surrounding the tub 344, but not connected, so that the trench 346 extends partially around a perimeter of the portion of dielectric layer material 340 surrounding the tub 344.

Figure 3D:
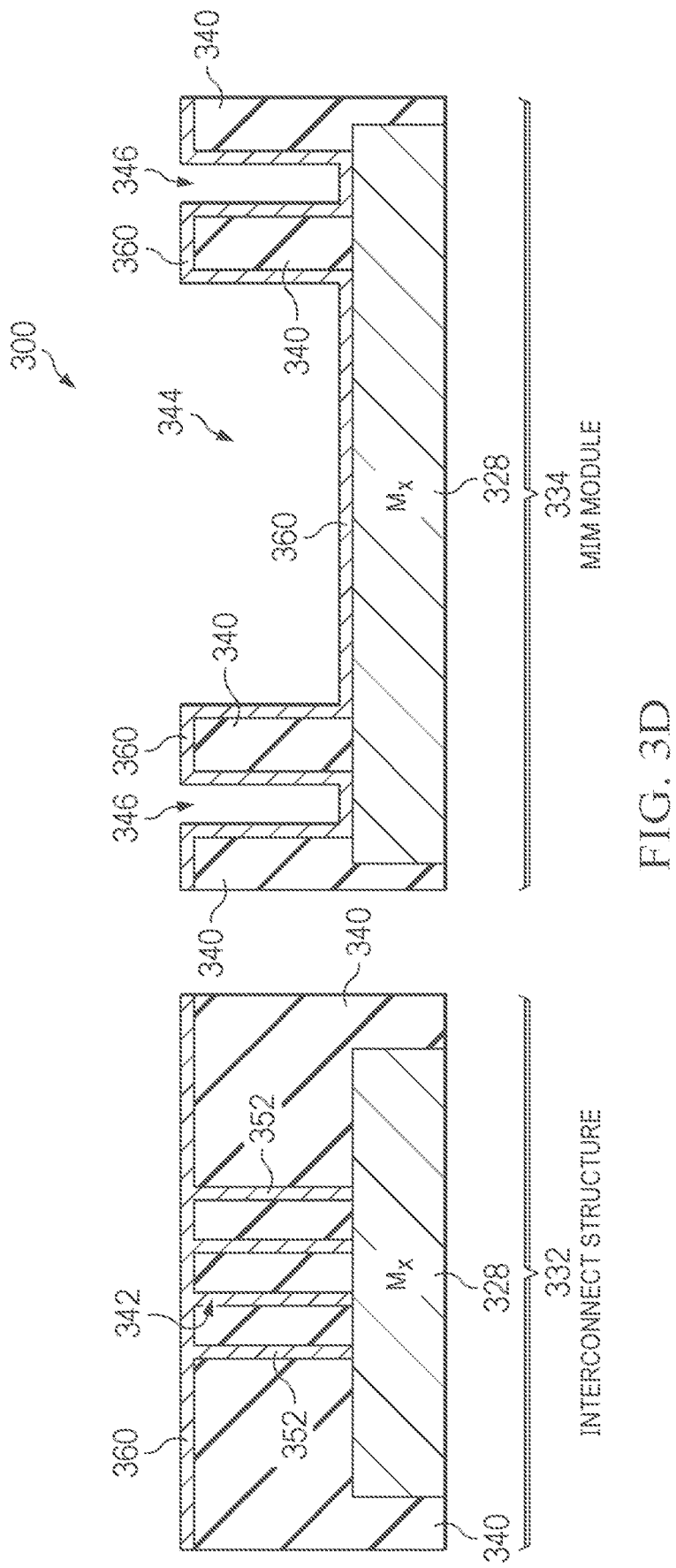
FIG. 3D shows a cross-sectional, side view of the wafer of FIG. 3A with a conformal metal layer deposited thereon for building a MIM capacitor in a MIM module simultaneously with an interconnect structure.

FIG. 3D shows application of a conformal metal layer 360, for example tungsten, W, to the wafer to make a MIM capacitor. A titanium nitride TiN liner (not shown), or glue layer may be deposited with thickness of about 50 Å-300 Å, followed by deposition of conformal metal layer 360, for example a tungsten W deposition. The conformal metal layer 360 may be by plasma enhanced chemical vapor deposition (PECVD) such that it is deposited with a substantially uniform thickness on all exposed surfaces. The conformal metal layer 360, for example tungsten W film, may have a relatively large tensile stress. The deposition thickness of the tungsten W layer may typically be limited to approximately 5000 A, and may have any suitable thickness for subsequently defining the insulator layer of the MIM capacitor being formed, e.g., a thickness in the range of 200-1000 Å, for example, 300-700 Å, for example, 400-600 Å, or about 500 Å. If the conformal metal layer 360 is too thick, it may cause peeling or wafer breakage at subsequent chemical mechanical polishing (CMP) of conformal metal layer 360. The via hole(s) 342 in the dielectric layer 340 of the interconnect structure 332 may be completely filled with conformal metal layer 360 to form via(s) 352, but the tub 344 and trench 346 may be partially filled with conformal metal layer 360.

Figure 3E:
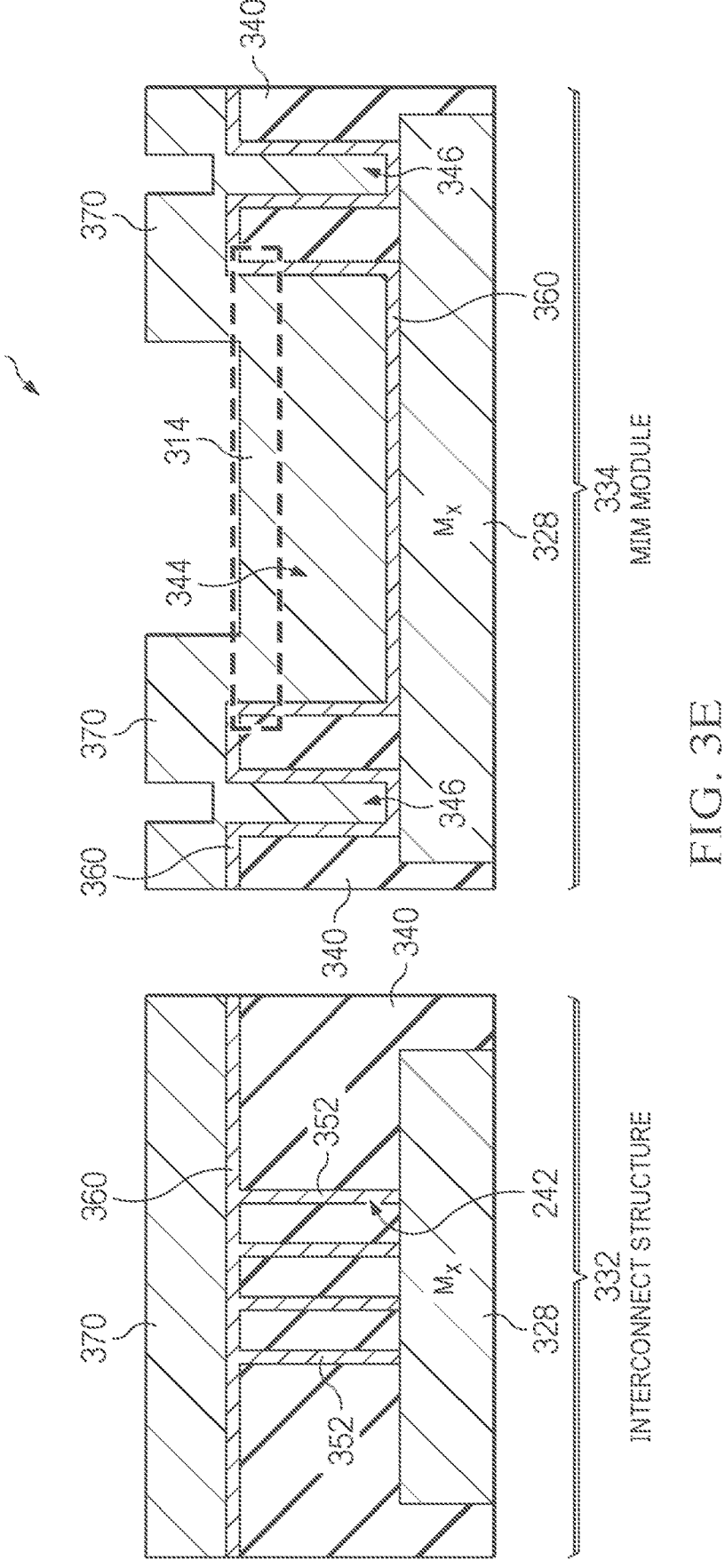
FIG. 3E shows a cross-sectional, side view of the wafer of FIG. 3B after bottom electrode metal has been deposited to the wafer.

FIG. 3E shows a deposition on the wafer to form a bottom electrode. A bottom electrode metal 370, for example titanium nitride (TiN), or titanium nitride (TiN) plus tungsten (W), may be deposited by physical vapor deposition (PVD) or a combination of PVD and chemical vapor deposition (CVD) methods. Titanium nitride (TiN) may have compressive stress (for film less than 1 um), and can be used to compensate the tensile stress of tungsten (W) used for the conformal metal layer 360. Refractory metal (TiN, W, and others) may not generate hillocks when used for the bottom electrode, which may also provide a higher, more consistent breakdown voltage. Alternatively, aluminum Al can be used with high radio-frequency RF power during deposition (a so called smooth metal) with large grain size and reduced film roughness. In the example shown in FIG. 3E, the bottom electrode metal 370 covers the interconnect structure 332 and completely fills the trenches 346 of the MIM module 334. The bottom electrode metal 370 also substantially fills or at least very nearly fills the tub 344 of the MIM module 334 to form a bottom electrode 314.

Figure 3F:
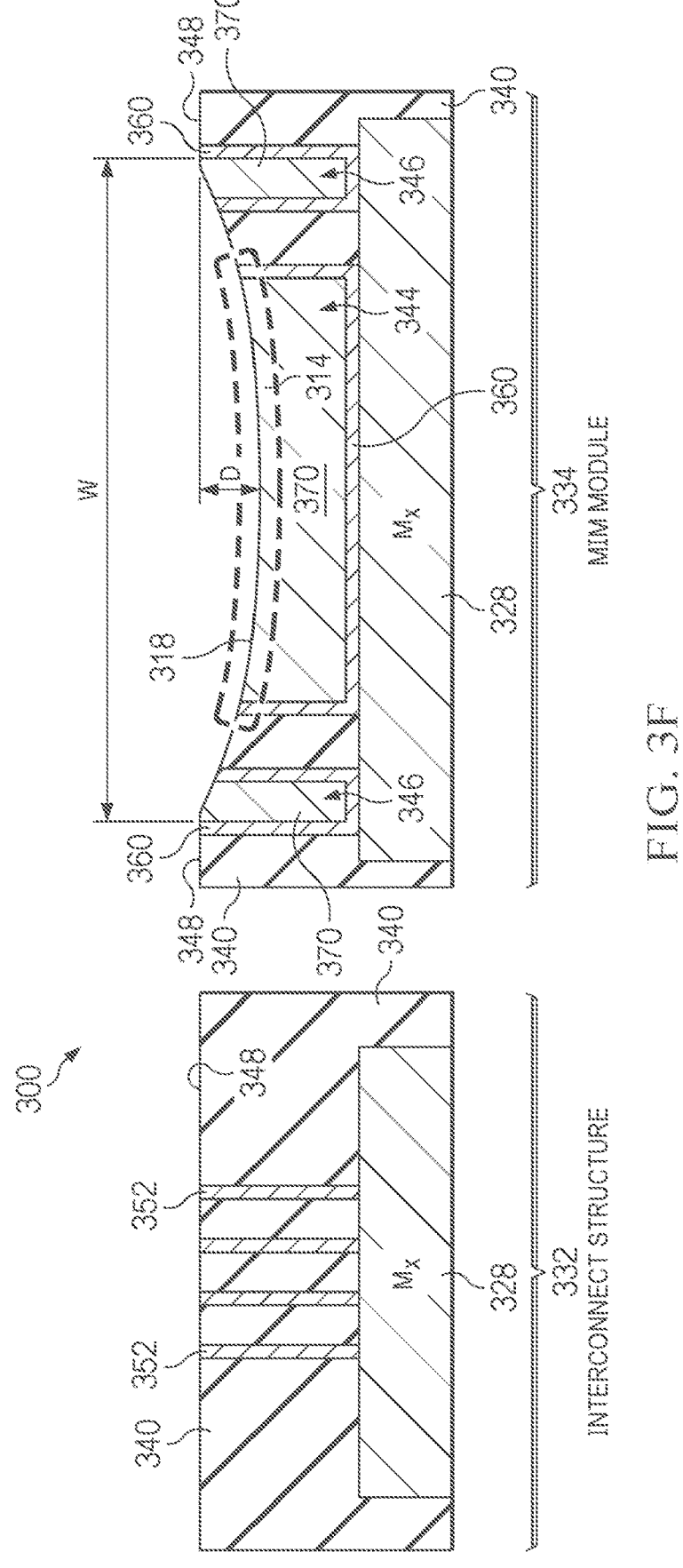
FIG. 3F shows a cross-sectional, side view of the interconnect structure and the MIM module of FIG. 3C after a first chemical mechanical polishing (CMP) of the wafer.

FIG. 3F shows cross-sectional, side views of the interconnect structure 332 and the MIM module 334 after a first chemical mechanical polishing (CMP) of the wafer. CMP may be performed to remove bottom electrode metal 370 and conformal metal layer 360 outside the via(s) 352 of the interconnect structure 332. CMP may further remove a portion of bottom electrode metal 370 and conformal metal layer 360 from the tub 344, and the trench(es) 346. High down force (HDF or high pressure) combined with patterns of trench 346 proximate the tub 344 allow intentional dishing of the MIM module 334, particular the top surface 318 of bottom electrode metal 370 within tub 344 is dish shaped, i.e. an upper surface 318 of bottom electrode metal 370 expresses a convex function. For clarity, a convex function is one wherein a line segment between any two points on the graph of the function lies above the graph between the two points. The polishing pressure may typically be 3-5 psi (pounds per square inches) or higher and high selectivity slurries (with significantly higher polishing rate for metal than dielectric materials) may be used for the first CMP process. Due to the reduced pattern density provided by the trench(es) 346 around the tub 344 (the formation of the trench reduces the pattern density), CMP may dish into the bottom electrode metal 370 in the tub 344 (significantly, a depth D within a range of about 0.1 μm-0.50 μm (i.e. 1000 Angstroms-5000 Angstroms), e.g., of approximately 0.2 μm, or 2000 A) and dish into the trench 346 (to a much less extent), creating a dish-shaped (somewhat concave) upper surface in the bottom electrode metal 370, particularly in the bottom electrode 314. The upper surface 318 of bottom electrode metal 370, which forms the bottom electrode of the MIM capacitor, is thus below the upper surface 348 of dielectric layer 340. The first CMP process may produce a smooth dish-shaped upper surface 318 that may provide for a higher breakdown voltage MIM capacitor (under construction). The first CMP process may remove a protrusion large enough to substantially reduce the breakdown voltage of the MIM capacitor. The polished dish-shaped upper surface 318 of the bottom electrode 314 may be hillock-free, which means the surface has no protrusions large enough to substantially reduce the breakdown voltage of the capacitor.

As shown in FIG. 3F, the curvature caused by the CMP for polishing is microscopic and is not significantly macroscopic. For example, dishing to a depth D of between about 0.1 μm and about 0.5 μm, e.g., about 0.2 μm (2000 A), may occur in a vertical direction (depth D) over horizontal scale (width W) of between about 1 μm and about 100 μm, e.g., approximately 10 μm, which represents a very small departure from a flat (planar) surface at an angle of about 2 degrees at the perimeter of the dishing in the tub 344 and trench(es) 346. The dish-shaped (somewhat concave) upper surface 318 may not impact capacitance match, because all dish-shaped upper surfaces polished in a single wafer may have about the same depth of dishing. Capacitance match is achieved when two capacitors have the same or very similar physical dimensions to retain the same or very similar capacitance values. Capacitance match may be an important characteristic for capacitors used in precision analog applications or in an SAR ADC (Successive Approximation Register Analog to Digital Converters). Variation of CMP dishing depth may be more likely between two different wafer lots due to consumable variations, such as polishing pad, polishing slurry and other factors. Within a single wafer, particularly within a die (device), the dishing variation may be very small, so capacitance matching may be preserved. Further, the finished dish-shaped (somewhat concave) upper surface 318 of the bottom electrode metal 370, particularly in the bottom electrode 314, may be polished to a smooth, hillock-free surface. The polished dish-shaped (somewhat concave) upper surface 318 may be hillock-free both at the time of manufacture and after later thermal cycles, wherein the refectory metal may not likely generate hillocks due to stress relief from subsequent thermal processes.

Figure 4:
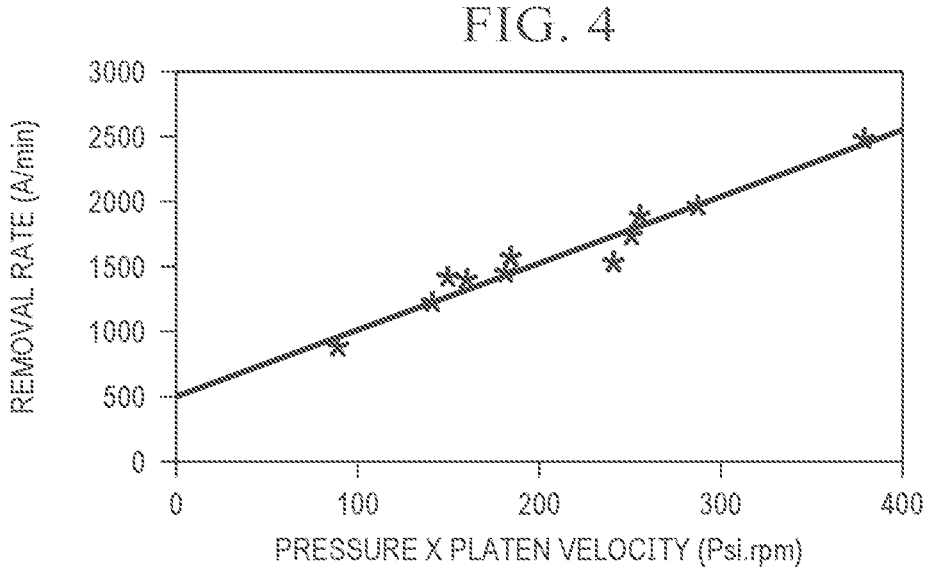
FIG. 4 shows how the Preston Equation may explain the removal rate of the bottom electrode metal.

As shown in FIG. 4, the Preston Equation may explain the use of a dummy trench pattern to generate a curved bottom electrode metal 370 in the tub. The removal rate of the chemical mechanical polishing (CMP) may be proportional to the down force and velocity.

$$RR = K_P * P * V$$

Where
RR=Removal Rate
$K_P$=Preston Coefficient
P=Applied Pressure
V=Linear Velocity The removal rate RR may increase with an increase of the downward applied pressure P and/or an increase of the linear velocity V.

Figure 3G:
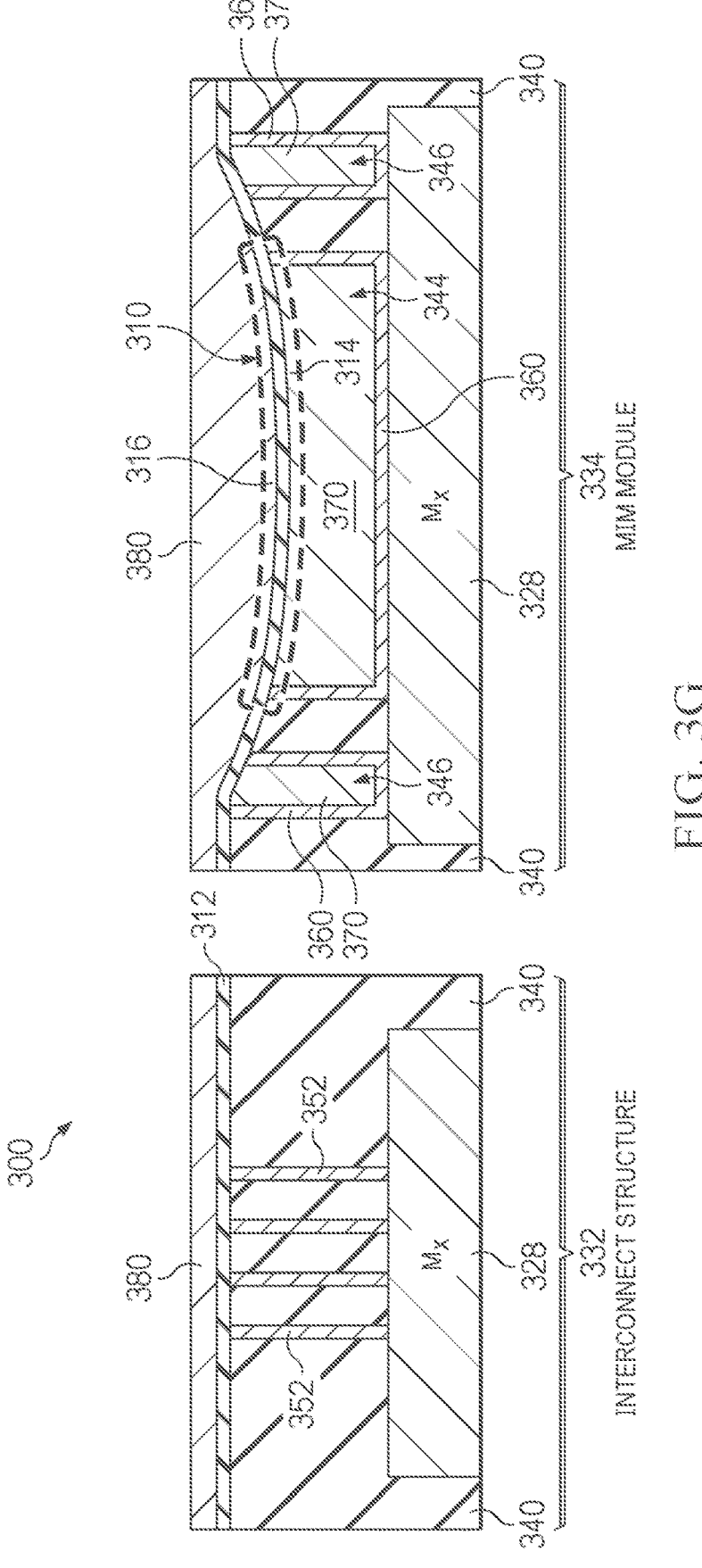
FIG. 3G shows a cross-sectional, side view of the interconnect structure and the MIM module of FIG. 3D after depositing an insulator and top electrode metal.
Figure 5A:
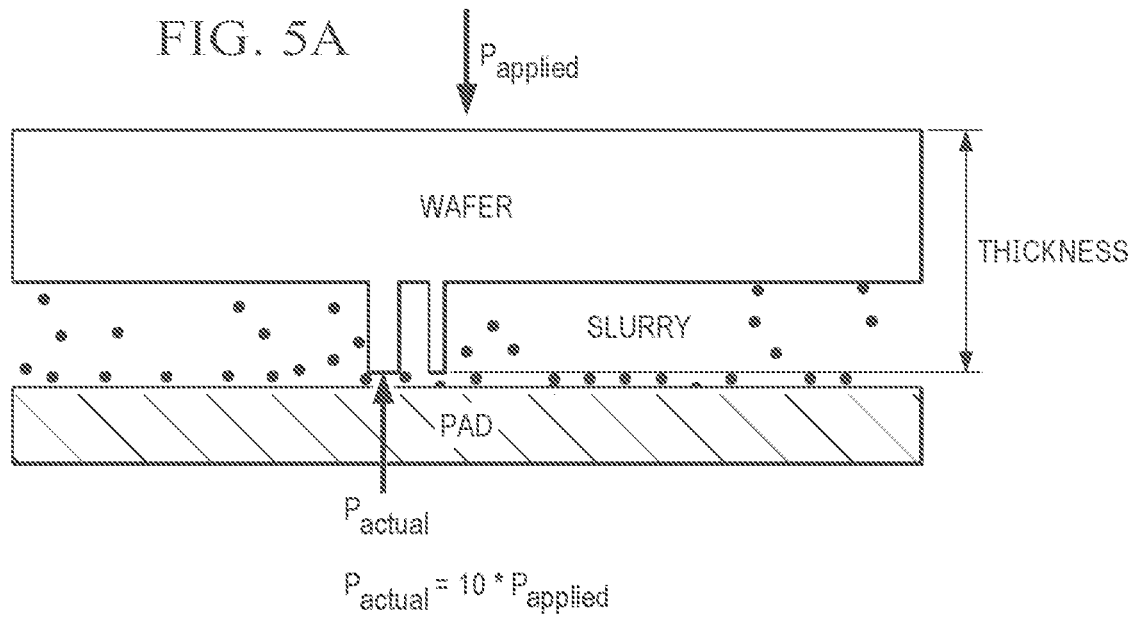
FIGS. 5A-5C show the implications of the Preston Equation, wherein the removal rate may be dependent on the pattern density.
Figure 5B:
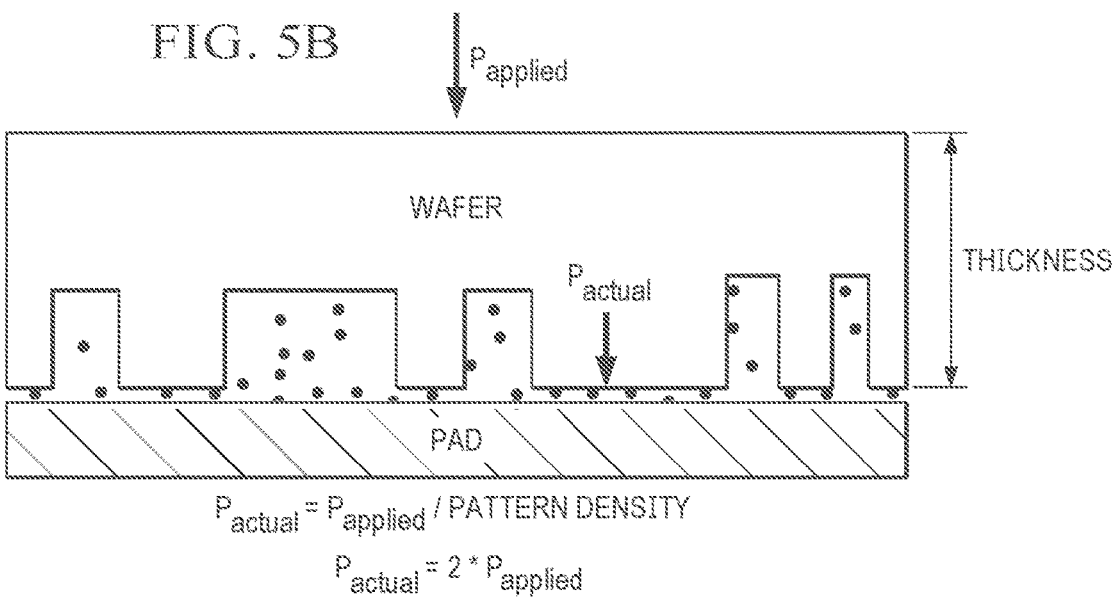
Figure 5C:
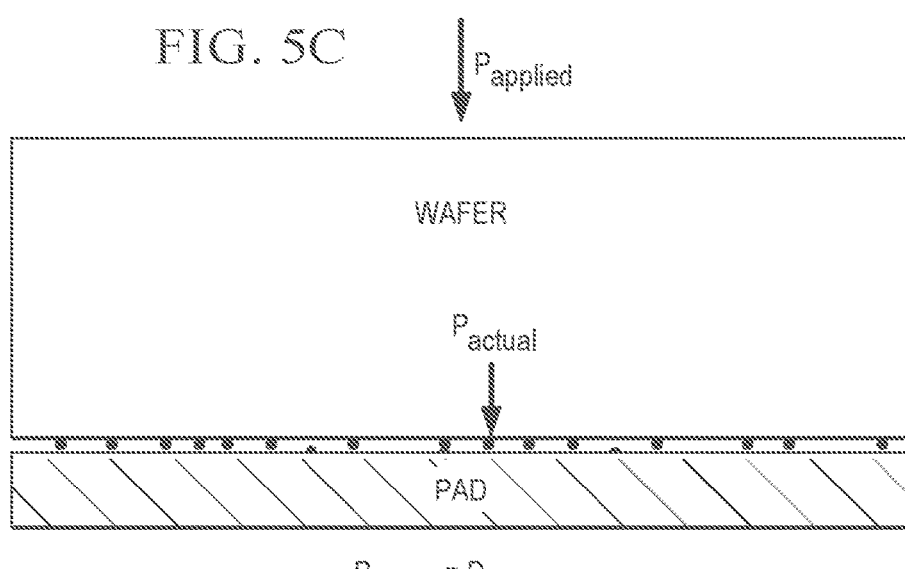

FIGS. 5A-5C show the implications of the Preston Equation, wherein the removal rate RR may be dependent on the local pattern density. By engineering the local pattern density, the amount of desired dishing and erosion of the bottom electrode metal may be achieved. A difference in pattern density may lead to a difference in polishing rate, such pattern density sensitivity can be engineered to produce a desired dishing and erosion. FIG. 5A shows a wafer with 10% pattern density ($P_{actual}=10*P_{applied}$). The removal rate at 10% pattern density may equal ten times the blanket remove rate, since the actual applied pressure is 10 times the applied pressure, since it is applied ultimately to only 10% of the wafer surface area, although the total material removed may be similar. FIG. 5B shows a wafer with 50% pattern density ($P_{actual}=2*P_{applied}$). The removal rate at 50% pattern density may equal two times the blanket removal rate, although the total material removed may be similar. FIG. 5C shows a wafer with no pattern ($P_{actual}=P_{applied}$), such that the wafer is already planarized FIG. 3G shows cross-sectional, side views of the interconnect structure 332 and the MIM module 334 after application of an insulator layer 312 and a top electrode metal 380. An insulator deposition may be followed by a top electrode metal deposition. The insulator layer 312 may be a layer of Silicon Nitride (SiN) with a thickness of approximately 500 A, and may be deposited through PECVD (Plasma Enhanced Chemical Vapor Deposition) on top of the finished dish-shaped (somewhat concave) upper surface 318 of the bottom electrode metal 370. Alternatively, the insulator layer 312 may be silicon oxide, or high k dielectrics (with k>7), such as, $Al_2O_3$ (κ~10), $Ta_2O_5$ (κ~25), and $HfO_2$ (κ~22), $ZrO_2$ (κ~35), and others, and may be deposited through ALD (Atomic Layer Deposition) on top of the finished dish-shaped (somewhat concave) upper surface 318 of the bottom electrode metal 370. The insulator layer 312 is thus similarly dish-shaped (somewhat concave). The insulator layer 312 may have a substantially uniform thickness between the top electrode 316 and the bottom electrode 314. The top electrode metal 380 may be titanium nitride (TiN), titanium plus titanium nitride (Ti+TiN), titanium nitride plus tungsten (TiN+W), aluminum (Al) or any suitable metals, deposited on top of the dish-shaped (somewhat concave) insulator layer 312. Hillocks in the top electrode metal may not be a concern for capacitor breakdown voltage. By deposition of both the insulator layer 312 and the top electrode metal 380, a MIM capacitor 310 may be built in the dished tub 344. The MIM capacitor 310 may comprise a bottom electrode 314, an insulator layer 312, and a top electrode 316.

Figure 3H:
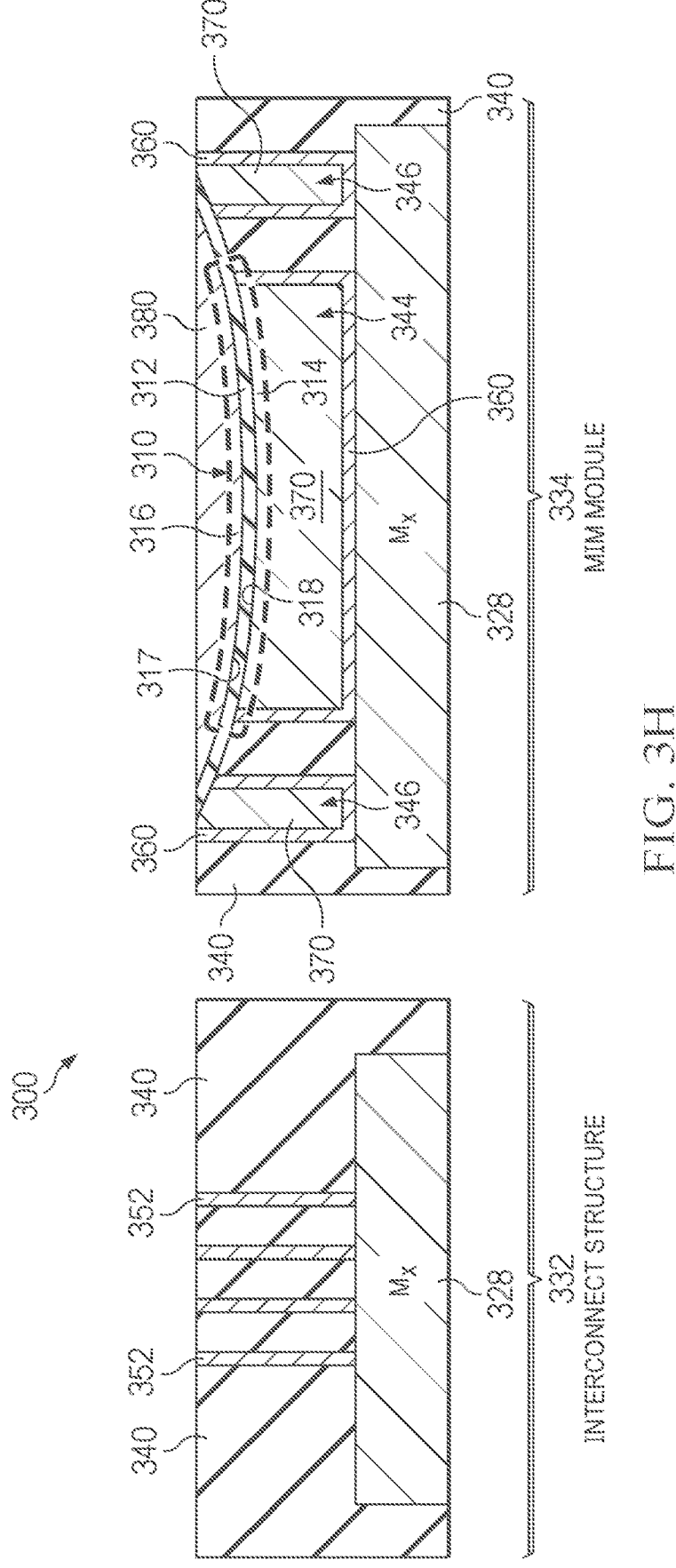
FIG. 3H shows a cross-sectional, side view of the interconnect structure and the MIM module of FIG. 3E after a second chemical mechanical polishing (CMP) of the wafer.
Figure 31:
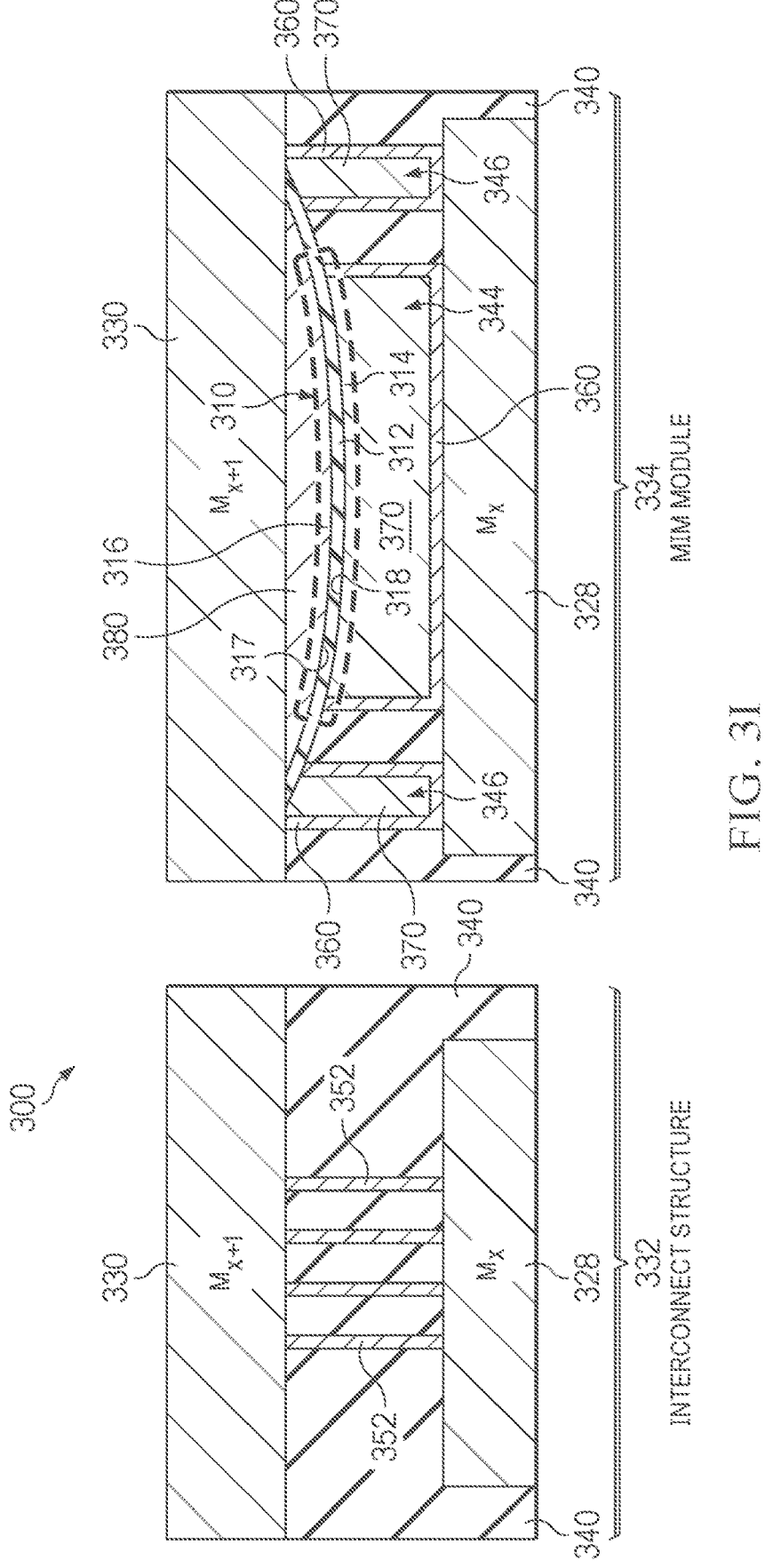

FIG. 3H shows cross-sectional, side views of the interconnect structure 332 and the MIM module 334 after a second chemical mechanical polishing (CMP) of the wafer. The second CMP may be performed to remove top electrode metal 380 and insulator layer 312 outside the via(s) 352 of the interconnect structure 332 and outside the tub 344 and the trench(es) 346 of the MIM module 334. The second CMP process may planarize the wafer surface, including a top surface of top electrode metal 380. A bottom surface 317 of top electrode metal 380, facing insulator layer 312, is curved matching the top surface of the dish-shaped (somewhat concave) insulator layer 312, which matches the top surface 318 of the bottom electrode 314, leaving a curved top electrode metal 380 forming a top electrode 316 in the tub 344 of the MIM module 334. A difference between the first CMP (see FIG. 3F) and the second CMP (see FIG. 3H) may be mainly the down force (pressure) used. The first CMP process may use a High Down Force (HDF or high pressure), together with dummy trench patterns around a tub to intentionally create dishing in the MIM module. The polishing pressure may typically be 3-5 psi (Pounds per Square Inches) or higher for the first CMP process. The second CMP process may use Low Down Force (LDF, or low pressure) to planarize the surface. The polishing pressure may be lower than the polishing pressure used for the first CMP process, e.g., 1-2 psi. The selectivity of slurries used for the first CMP and the second CMP may also be different. The first CMP process may use a high selectivity slurry, which polishes metals such a conformal metal layer 360 and bottom electrode metal 370 at much higher rate than oxide. The second CMP process may use a low selectivity slurry, which polishes metals such as top electrode metal 380 at similar rate as dielectrics (for example insulator layer 312 and oxide).

FIG. 3I shows cross-sectional, side views of the interconnect structure 332 and the MIM module 334 after an Mx+1 metal layer 330 deposition may be formed on the wafer. This Mx+1 metal layer 330 may be formed as part of CMOS interconnect construction.

Figure 3J:
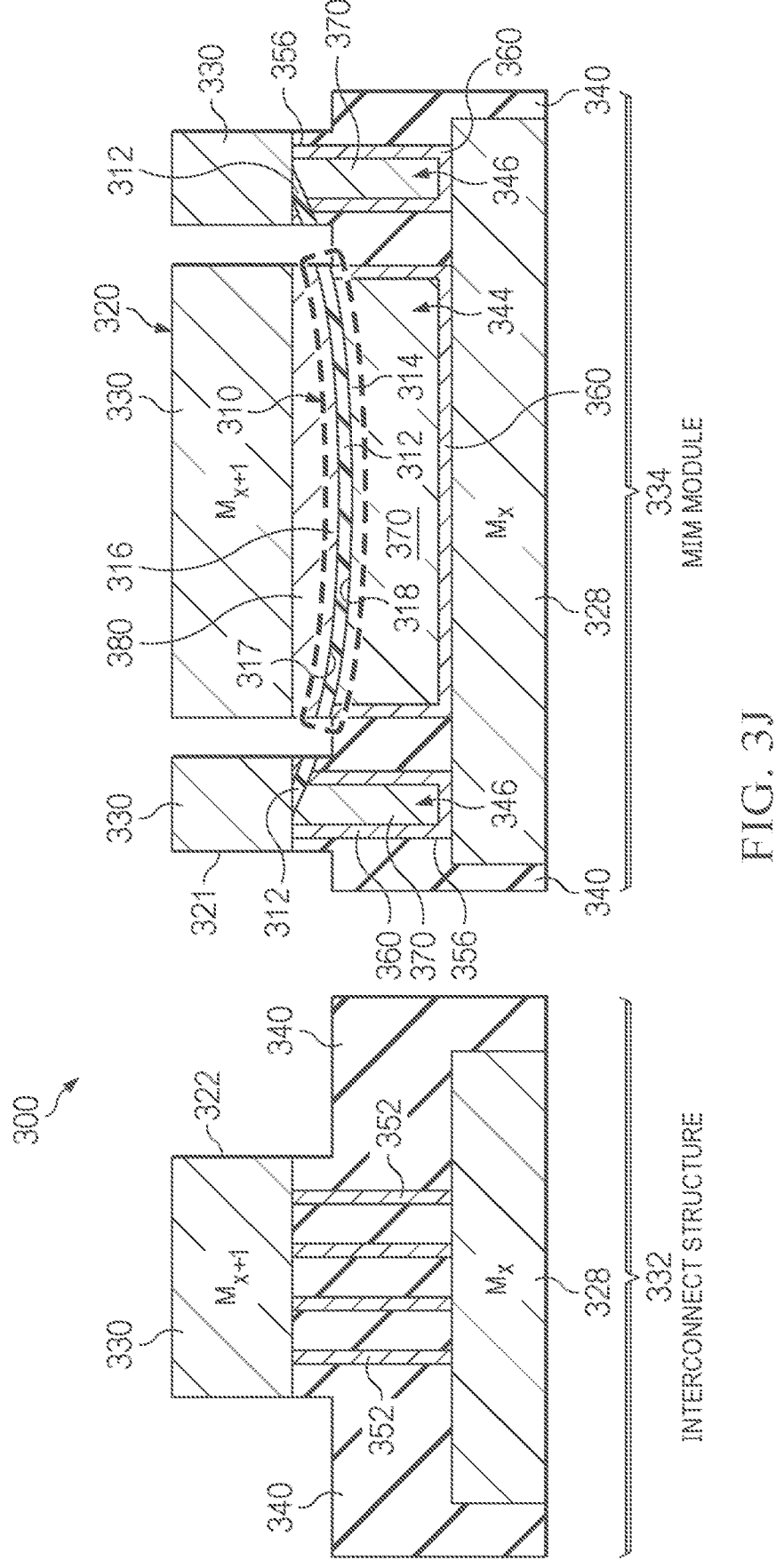
FIG. 3J shows a cross-sectional, side view of the interconnect structure and the MIM module of FIG. 3G after the Mx+1 metal layer has been patterned and etched.

FIG. 3J shows cross-sectional, side views of the interconnect structure 332 and the MIM module 334 after metal patterning and etching. The Mx+1 metal layer 330 may be patterned and etched. This may be part of the CMOS interconnect construction. A slight over-etch may be utilized to etch through the top electrode metal 380 layer in the area between the tub 344 and the trench(es) 346 to avoid shorting. The MIM capacitor 310 is fully built in the dielectric layer 340 between Mx metal layer 328 and Mx+1 metal layer 330. The MIM capacitor 310 has a bottom electrode 314, an insulator layer 312, and a top electrode 316. The bottom electrode 314 electrically connects with the Mx metal layer 328 through the bottom electrode metal 370 and the conformal metal layer 360 in the tub 344. In the interconnect structure 332, a bottom electrode pad 322 is formed in the Mx+1 metal layer 330 and electrically connects with the Mx metal layer 328 through the via(s) 352, in an example where the Mx metal layer 328 of interconnect structure 332 is formed contiguously with the Mx metal layer 328 of MIM module 334. In the MIM module 334, a top electrode pad 320 in the Mx+1 metal layer 330 electrically connects with the top electrode 316 through a portion of the top electrode metal 380. An optional bottom electrode pad 321 may also be formed in the Mx+1 metal layer 330 and electrically connect with the Mx metal layer 328 through a bottom electrode connection 356, which may be formed in a trench 346 by conformal metal layer 360 and bottom electrode metal 370. As shown in FIG. 3J, the MIM module 334 is complete and ready for the wafer to continue to CMOS interconnect construction.

Figure 6:
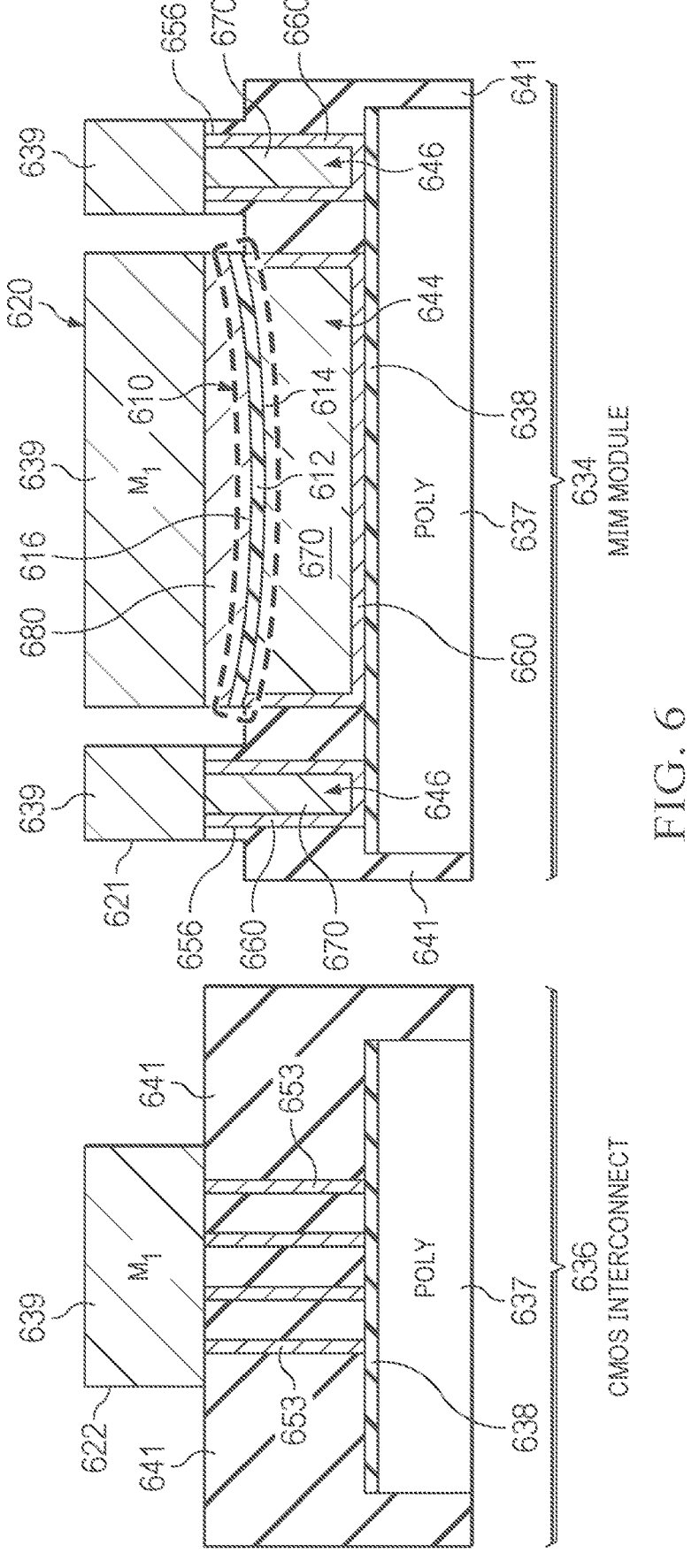
FIG. 6 shows cross-sectional, side views of a MIM capacitor built between a silicided poly layer and a M1 metal layer.

As shown in FIG. 6, a MIM capacitor 610 may alternatively be built between a silicided poly layer and a M1 metal layer. In the case of poly silicide, the dielectric layer may be a poly-metal dielectric (PMD) layer. The poly silicide layer 638 may be on a poly layer 637. The MIM capacitor 610 may be built in poly-metal dielectric (PMD) layer 641 between a poly silicide layer 638 and a M1 metal layer 639. The MIM capacitor 610 has a bottom electrode 614, an insulator layer 612, and a top electrode 616. The bottom electrode 614 electrically connects with the poly silicide layer 638 through the bottom electrode metal 670 and the conformal metal layer 660 in the tub 644. A bottom electrode pad 622 is formed in the M1 metal layer 639 and electrically connects with the poly silicide layer 638 through the contact(s) 653, in an example where the poly silicide layer 638 of CMOS interconnect structure 636 is formed contiguously with the poly silicide layer 638 of MIM module 634. A top electrode pad 620 in the M1 metal layer 639 electrically connects with the top electrode 616 through the top electrode metal 680. An optional bottom electrode pad 621 may also be formed in the M1 metal layer 639 and electrically connect with the poly silicide layer 638 through a bottom electrode connection 656, which may be formed in a trench 646 by conformal metal 660 and bottom electrode metal 670. The bottom electrode 614 may be made of refractory metal and may be polished so the surface is smooth and substantially hillock-free. For purposes of this disclosure, hillock-free means the surface has no hillocks or protrusions large enough to substantially reduce the break-down voltage of the MIM capacitor 610.

The dish MIM capacitor structure may be different than other MIM structures. It may have a slightly curved insulator layer, and the bottom electrode surface may be smooth (polished) and hillock-free (refractory metals). Trench(es) (single or multiple) surrounding the tub, may be used to provide a local pattern density to facilitate polishing to create a curved bottom electrode surface, and optionally to connect to the bottom electrode. Different pattern densities may provide different curved bottom electrode surfaces. The MIM capacitor may be built between two metal layers, or between a silicided poly layer and an M1 metal layer.

FIG. 7 shows a method of manufacture, wherein an MIM capacitor may be built concurrently with interconnect struc-tures without the use of additional masks. Deposit 702 a dielectric layer and etch a via hole(s), a tub, and a trench(es). The pattern of a trench or trenches surrounding the tub reduces the pattern density. See FIGS. 3A-3C. Deposit 704 conformal metal to form the via(s). A layer of tungsten W deposition may be by plasma enhanced chemical vapor deposition (PECVD) and may be conformal, such that it is deposited with a substantially uniform thickness on all exposed surfaces. The via hole(s) may be completely filled with conformal metal of the conformal metal layer (for example, tungsten W), but the tub and trench(es) may be partially filled with conformal metal. See FIG. 3D. Deposit 706 bottom electrode metal to form a bottom electrode. See FIG. 3E. Remove 708 a portion of bottom electrode metal to create a dish in the tub. The wafer is polished by chemical mechanical polishing (CMP) with high down force (HDF or high pressure) and/or a high selectivity slurry to remove bottom electrode metal and the conformal metal outside the via, the tub, and the trench, and to dish into the tub (greater extent) and the trench (much less extent), creating a curved bottom electrode surface in the tub. See FIG. 3F. Deposit 710 an insulator layer on the dish-shaped upper surface 318, i.e. onto the exposed surfaces, thereby coating the dish shaped upper surface 318 of the bottom electrode metal 370. In one example, Silicon Nitride (SiN) is deposited through PECVD (Plasma Enhanced Chemical Vapor Deposition). Alternatively, silicon oxide or a high k dielectric is deposited by ALD (Atomic Layer Deposition). See FIG. 3G. Deposit 712 a top electrode metal on the insulator layer to overfill the dish, i.e, to fully cover the insulator layer and fill any depression caused by the removal of 708. The top electrode metal may be titanium nitride (TiN), titanium plus titanium nitride (Ti+TiN), titanium nitride plus tungsten (TiN+W), aluminum (Al) or any suitable metals. See FIG. 3G. Remove 714 excess top electrode metal to form a top electrode in the dish. The wafer is polished by chemical mechanical polish-ing (CMP) with Low Down Force (LDF, or low pressure) and/or a Low Selectivity slurry to planarize the surface and to remove top electrode metal and insulator outside the via, the tub, and the trench. See FIG. 3H. Form 716 a metal layer on the wafer by deposition, which may be part of CMOS interconnect construction. See FIG. 3I. Pattern and etch 718 the metal layer through the top electrode metal layer in the area between the tub and the trench, which may be part of the CMOS interconnect construction. See FIG. 3J.

Figure 8:
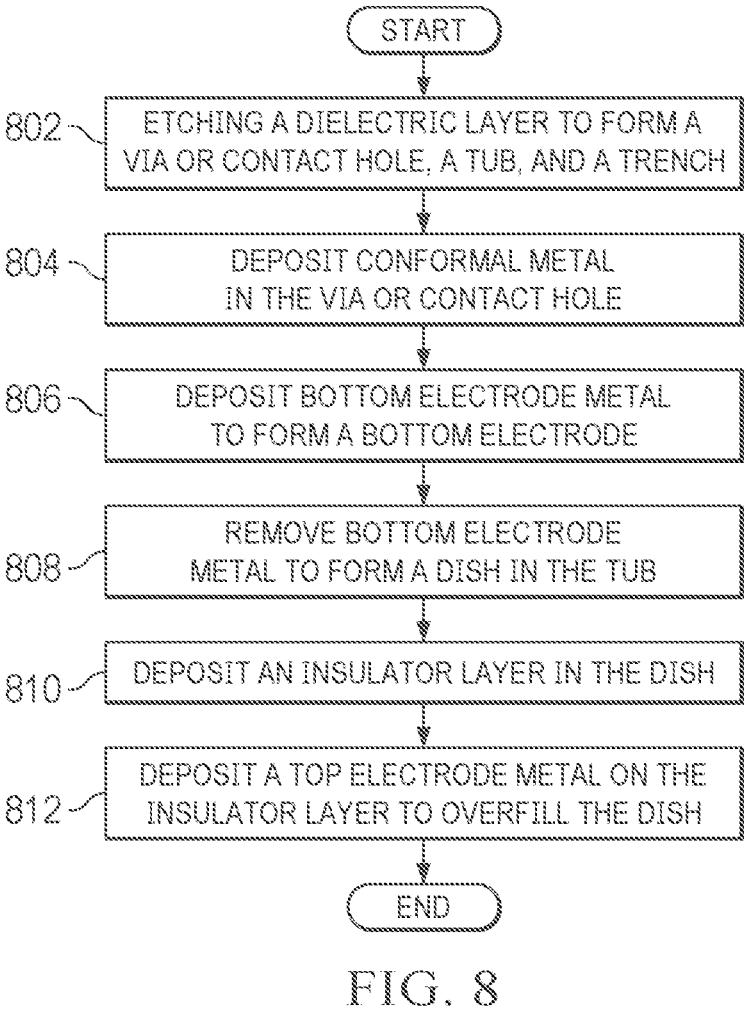
FIG. 8 shows a flow chart for a method of building a MIM capacitor.

FIG. 8 shows a method of building a MIM capacitor in a MIM module concurrently with an interconnect structure without the use of an additional mask. Etching 802 a dielectric layer to form a via or contact hole, a tub, and a trench in the dielectric layer. Depositing 804 conformal metal in the via or contact hole, the tub, and the trench, wherein deposited conformal metal forms a via or contact in the via or contact hole. Depositing 806 a bottom electrode metal in the tub to form a bottom electrode of a Metal-Insulator-Metal (MIM) capacitor. Removing 810 a portion of bottom electrode metal from the bottom electrode to form a dish-shape upper surface. Depositing 812 an insulator material on the bottom electrode to form an insulator layer of the MIM capacitor. Depositing 814 a top electrode metal on the insulator layer to form a top electrode of the MIM capacitor.

Figure 9:
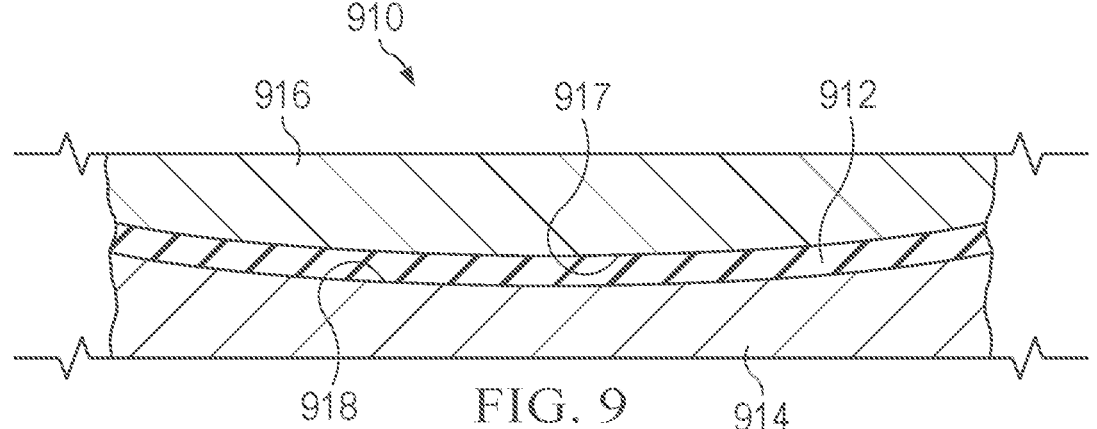
FIG. 9 shows a cross-sectional side view of a MIM capacitor with curved surfaces.

FIG. 9 shows a cross-sectional, side view of a MIM capacitor 910. The MIM capacitor 910 has a bottom elec-trode 914, an insulator layer 912, and a top electrode 916. The bottom electrode 914 has an upper dish-shaped surface 918. For purposes of this disclosure, "dish-shaped surface" means a surface that is non-planar. The top electrode 916 has a substantially convex surface 917 positioned opposite the dish-shape surface 918 of the bottom electrode 914, sepa-rated from the dish-shape surface 918 of the bottom elec-trode 914 by insulator layer 912, which is similarly shaped, i.e. with a substantially convex surface positioned opposite the dish-shape surface 918 of the bottom electrode 914, and a substantially concave surface opposite the substantially convex surface 917 of the top electrode 916.

Aspects may be used in any wafer FAB. The integration of the process described herein may be compatible with foundry CMOS process flow.

Although examples have been described above, other variations and examples may be made from this disclosure without departing from the spirit and scope of these dis-closed examples.

The invention claimed is:

1. A method comprising: etching a dielectric layer to form a via or contact hole, a tub, and a trench in the dielectric layer, wherein the trench is adjacent to the tub;

depositing conformal metal in the via or contact hole, the tub, and the trench, wherein deposited conformal metal forms a via or contact in the via or contact hole, respectively;

depositing a bottom electrode metal in the tub to form a bottom electrode of a metal-insulator-metal (MIM) capacitor;

removing a portion of the bottom electrode metal from the bottom electrode to form a dish-shape upper surface, comprising removing bottom electrode metal to a depth sufficient to build a MIM capacitor whose bottom electrode is below an upper surface of the dielectric layer;

depositing an insulator material on the bottom electrode to form an insulator layer of the MIM capacitor; and depositing a top electrode metal on the insulator layer to form a top electrode of the MIM capacitor.

2. The method of claim 1, wherein removing the portion of the bottom electrode metal from the bottom electrode comprises chemical-mechanical polishing.

3. The method of claim 1, wherein removing the portion of the bottom electrode metal from the bottom electrode comprises chemical mechanical polishing with a down force and a selectivity slurry sufficient to remove the portion of the bottom electrode metal from the tub.

4. The method of claim 1, wherein removing the portion of the bottom electrode metal from the bottom electrode of the MIM capacitor comprises removing by polishing a protrusion large enough to substantially reduce the break-down voltage of the MIM capacitor.

5. The method of claim 1, wherein removing the portion of the bottom electrode metal from the bottom electrode comprises dishing the bottom electrode to a depth of between about 0.1 μm and about 0.5 μm and a width of between about 1 μm and about 100 μm.

6. The method of claim 1, wherein the via or contact is a via, and comprising:

depositing the dielectric layer on a lower metal layer;

depositing an upper metal layer on the via and the top electrode; and etching a pattern in the upper metal layer to form a bottom electrode pad electrically connected with the bottom electrode through the via and to form a top electrode pad electrically connected with the top electrode.

7. The method of claim 1, wherein the via or contact is a contact, and comprising:

depositing the dielectric layer on a poly silicide layer;

depositing a metal layer on the contact and the top electrode; and etching a pattern in the metal layer to form a bottom electrode pad electrically connected with the bottom electrode through the contact and to form a top electrode pad electrically connected with the top electrode.

8. A semiconductor device made by a process, the process comprising:

etching a dielectric layer to form a via or contact hole, a tub, and a trench in the dielectric layer, wherein the trench is adjacent to the tub;

depositing conformal metal in the via or contact hole, the tub, and the trench, wherein deposited conformal metal forms a via or contact in the via or contact hole, respectively;

depositing a bottom electrode metal in the tub to form a bottom electrode of a metal-insulator-metal (MIM) capacitor;

removing a portion of the bottom electrode metal from the bottom electrode to form a dish-shape upper surface, comprising removing bottom electrode metal to a depth sufficient to build a MIM capacitor whose bottom electrode is below an upper surface of the dielectric laver;

depositing an insulator material on the bottom electrode to form an insulator layer of the MIM capacitor; and depositing a top electrode metal on the insulator layer to form a top electrode of the MIM capacitor.

9. The semiconductor device made by the process of claim 8, wherein removing the portion of the bottom electrode metal from the bottom electrode comprises chemical-mechanical polishing.

10. The semiconductor device made by the process of claim 8, wherein removing the portion of the bottom electrode metal from the bottom electrode comprises chemical mechanical polishing with a down force and a selectivity slurry sufficient to remove the portion of the bottom electrode metal from the tub.

11. The semiconductor device made by the process of claim 8, wherein removing the portion of the bottom electrode metal from the bottom electrode of the MIM capacitor comprises removing a protrusion large enough to substantially reduce the breakdown voltage of the MIM capacitor.

12. The semiconductor device made by the process of claim 8, wherein removing the portion of the bottom electrode metal from the bottom electrode comprises dishing the bottom electrode to a depth of between about 0.1 μm and about 0.5 μm and a width of between about 1 μm and about 100 μm.

13. The semiconductor device made by the process of claim 8, wherein the via or contact is a via, and comprising:

depositing the dielectric layer on a lower metal layer;

depositing an upper metal layer on the via and the top electrode; and etching a pattern in the upper metal layer to form a bottom electrode pad electrically connected with the bottom electrode through the via and to form a top electrode pad electrically connected with the top electrode.

14. The semiconductor device made by the process of claim 8, wherein the via or contact is a contact, and comprising:

depositing the dielectric layer on a poly silicide layer;

depositing a metal layer on the contact and the top electrode; and etching a pattern in the metal layer to form a bottom electrode pad electrically connected with the bottom electrode through the contact and to form a top electrode pad electrically connected with the top electrode.

15. A method comprising:

etching a dielectric layer to form a via or contact hole, a tub, and a trench in the dielectric layer, wherein the trench is adjacent to the tub;

depositing conformal metal in the via or contact hole, the tub, and the trench, wherein deposited conformal metal forms a via or contact in the via or contact hole, respectively;

depositing a bottom electrode metal in the tub to form a bottom electrode of a metal-insulator-metal (MIM) capacitor;

removing a portion, of the bottom electrode metal from the bottom electrode, large enough to substantially reduce the breakdown voltage of the MIM capacitor, comprising removing bottom electrode metal to a depth sufficient to build a MIM capacitor whose bottom electrode is below an upper surface of the dielectric laver;

depositing an insulator material on the bottom electrode to form an insulator layer of the MIM capacitor; and depositing a top electrode metal on the insulator layer to form a top electrode of the MIM capacitor.

16. The method of claim 15, wherein removing the portion of the bottom electrode metal from the bottom electrode comprises dishing the bottom electrode to a depth of between about 0.1 μm and about 0.5 μm and a width of between about 1 μm and about 100 μm.

17. The method of claim 15, wherein the via or contact is a via, and comprising:

depositing the dielectric layer on a lower metal layer;

depositing an upper metal layer on the via and the top electrode; and etching a pattern in the upper metal layer to form a bottom electrode pad electrically connected with the bottom electrode through the via and to form a top electrode pad electrically connected with the top electrode.

18. The method of claim 15, wherein the via or contact is a contact, and comprising:

depositing the dielectric layer on a poly silicide layer;

depositing a metal layer on the contact and the top electrode; and etching a pattern in the metal layer to form a bottom electrode pad electrically connected with the bottom electrode through the contact and to form a top electrode pad electrically connected with the top electrode.

19. The method of claim 1, wherein removing a portion of the bottom electrode metal from the bottom electrode comprises removing at a removal rate dependent on a local pattern density of the trench.

20. The method of claim 1, wherein the trench comprises a continuous trench around the perimeter of the tub.

21. The method of claim 1, wherein the trench comprises a segmented trench comprising a series of separate trenches around the perimeter of the tub.

\* \* \* \* \*